US 6,699,743 B2

(12) United States Patent
Moore et al.

(10) Patent No.: US 6,699,743 B2
(45) Date of Patent: *Mar. 2, 2004

(54) MASKED NITROGEN ENHANCED GATE OXIDE

(75) Inventors: John T. Moore, Boise, ID (US); Mark Fischer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/198,215

(22) Filed: Jul. 17, 2002

(65) Prior Publication Data

US 2002/0182811 A1 Dec. 5, 2002

Related U.S. Application Data

(63) Continuation of application No. 09/641,067, filed on Aug. 17, 2000, now Pat. No. 6,458,663.

(51) Int. Cl.[7] .................... H01L 21/8238; H01L 21/336
(52) U.S. Cl. ..................... 438/216; 438/287; 438/275; 438/591
(58) Field of Search ................ 438/216, 287, 438/275, 591, 199, 787, 788

(56) References Cited

U.S. PATENT DOCUMENTS

| 6,017,808 | A | 1/2000 | Wang et al. ............. 438/528 |
| 6,033,998 | A | 3/2000 | Aronowitz et al. ........ 438/787 |
| 6,087,236 | A | 7/2000 | Chau et al. ............. 438/231 |
| 6,261,973 | B1 | 7/2001 | Misium et al. ........... 438/788 |
| 6,458,663 | B1 * | 10/2002 | Moore et al. ............ 438/287 |

FOREIGN PATENT DOCUMENTS

JP 4-154162 5/1992

* cited by examiner

*Primary Examiner*—Michael Trinh
(74) *Attorney, Agent, or Firm*—TraskBritt

(57) ABSTRACT

The present invention provides a method for fabricating improved integrated circuit devices. The method of the present invention enables selective hardening of gate oxide layers and includes providing a semiconductor substrate having a gate oxide layer formed thereover. A resist is then formed over the gate oxide layer and patterned to expose one or more areas of the gate oxide layer which are to be hardened. The exposed portions of the gate oxide layer are then hardened using a true remote plasma nitridation (RPN) scheme or a high-density plasma (HDP) RPN scheme. Because the RPN scheme used in the method of the present invention runs at low temperature, the patterned resist remains stable through the RPN process, and those areas of gate oxide layer which are exposed by the patterned resist are selectively hardened by the RPN treatment, while those areas covered by the patterned resist remain unaffected. The method of the present invention is extremely adaptable and may further include additional thermal oxidation steps used to thicken non-hardened portions of the gate oxide layer, as well as additional masking, and hardening steps, which may provide multiple hardened or non-hardened portions of varying thicknesses within a single gate oxide layer. Thus, the method of the present invention may be used to fabricate an IC device having selectively hardened N-channel and P-channel devices having gate oxides of varying thickness.

20 Claims, 4 Drawing Sheets

MASKED NITROGEN ENHANCED GATE OXIDE

CROSS-REFERENCE TO RELATED APPLICATIONS

This application is a continuation of application Ser. No. 09/641,067, filed Aug. 17, 2000, now U.S. Pat. No. 6,458,663, issued Oct. 1, 2002.

BACKGROUND OF THE INVENTION

1. Field of the Invention

The present invention relates to fabrication of transistors in integrated circuit devices. Specifically, the present invention provides an improved method for fabricating an integrated circuit device including N-channel and P-channel transistors having selectively hardened gate oxides.

2. State of the Art

State of the art integrated circuit (IC) devices generally require transistors including hardened gate oxides. As feature dimensions continually decrease, gate oxides are hardened in order to prevent diffusion of dopants from overlying layers into and through the gate oxide, to prevent breakdown at voltages below normal operating parameters, and to confer resistance to hot electron degradation. State of the art transistors including hardened gate oxides, therefore, often possess performance and reliability advantages relative to transistors including non-hardened gate oxides applied in the same context. However, hardened gate oxides are not desirable in all IC applications, and known methods for hardening gate oxides often require significant design and performance tradeoffs.

While it is generally preferred to harden the gate oxides of P-channel devices due to the nature of P-type dopants, such is not the case for N-channel devices. Hardening of N-channel devices is generally not necessary as N-type dopants do not readily diffuse through non-hardened gate oxides. Moreover, hardening N-channel devices is often undesirable due to compounding performance problems. As is well known, hardening of gate oxides included in N-channel devices leads to significant threshold voltage ($V_T$) roll-off. While $V_T$ roll-off can be counteracted through enhancement implants, the increased dopant concentration resulting from enhancement implants causes additional performance problems, such as refresh degradation and reduced surface mobility. Therefore, it would generally be advantageous not to harden the gate oxides of N-channel devices included within an IC device.

Despite the difficulties generally resulting from hardening the gate oxides of N-channel devices, however, the ability to selectively harden the gate oxides of N-channel devices in particular instances would be advantageous.

Additionally, as is also well known, it is often desirable to include P-channel or N-channel devices having gate oxides of varying thicknesses within a single IC device. For instance, it is beneficial to provide N-channel devices with gate oxides which are thicker than the thin, hardened gate oxides generally included in P-channel devices. Increasing the thickness of non-hardened N-channel gate oxides increases the $V_T$ of the corresponding N-channel devices, thereby decreasing control and performance the same. Moreover, it may also be advantageous to fabricate an IC device including hardened P-channel or N-channel devices incorporating hardened gate oxides of varying thicknesses.

Therefore, an ideal method for fabricating IC devices would facilitate simple and low-cost fabrication of IC devices including P-channel and N-channel devices which have been selectively hardened and which may include hardened or non-hardened gate oxides of varying thicknesses. However, known methods for hardening gate oxides generally do not provide the flexibility needed to enable selective hardening of gate oxides within an IC device. Furthermore, though it is possible to fabricate hardened gate oxides of varying thicknesses using known techniques, such techniques generally require additional etch steps, which are costly and serve as an additional source of error in a fabrication process.

For example, known methods for hardening gate oxides included in an IC device, such as a dynamic random access memory (DRAM) device, often require blanket hardening of a gate oxide layer deposited over a semiconductor substrate. During subsequent fabrication steps, both N-channel and P-channel gate oxides must then be formed using the blanket hardened gate oxide layer. Consequently, every one of the N-channel and P-Channel devices included in the subsequently formed IC device includes a hardened gate oxide. Blanket hardening processes simply do not enable selective hardening of particular areas of the gate oxide layer and, thereby, compromise the quality of IC devices fabricated by such methods.

Additionally, blanket hardening techniques cause difficultly in fabricating IC devices including gate oxides of varying thicknesses. Hardened oxide layers generally will not grow significantly during subsequent thermal oxidation processes. Therefore, to fabricate an IC device having gate oxides of various thicknesses using a blanket hardening process, the gate oxide layer must be formed such that, after hardening, the hardened gate oxide layer is as thick as the thickest desired gate oxide. The hardened gate oxide layer must then be selectively etched back to a desired thickness where P-channel or N-channel devices having thinner gate oxides are to be formed. Such a process is disadvantageous because it adds the cost and complication associated with one or more additional etch steps. Moreover, known etching processes are difficult to control where only minute amounts of material must be removed. Thus, as the thickness of state of the art gate oxides shrinks well below 70 Å, the need to etch back a hardened gate oxide layer becomes increasingly problematic and can only serve as a source of error, decreasing fabrication throughput as well as device reliability.

As can be appreciated, an improved method for fabricating IC devices including selectively hardening gate oxides is needed. Such an improved method should not only enable fabrication of P-channel and N-channel devices including selectively hardened gate oxides but also enable fabrication of such devices including hardened or non-hardened gate oxides of varying thicknesses without requiring additional etch steps.

SUMMARY OF THE INVENTION

The present invention provides a method for fabricating IC devices which answers the foregoing needs. The method of the present invention includes providing a semiconductor substrate having a gate oxide layer formed thereover. A resist is then formed over the gate oxide layer and patterned to expose one or more areas of the gate oxide layer which are to be hardened. The exposed portions of the gate oxide layer are then hardened using a true remote plasma nitridation (RPN) scheme or a high-density plasma (HDP) RPN scheme. Because the RPN scheme used in the method of the present invention runs at low temperature, the patterned resist remains stable through the RPN process. Therefore, those areas of gate oxide layer which are exposed by the patterned resist are selectively hardened by the RPN treatment, while those areas covered by the patterned resist remain unaffected.

The method of the present invention may also include additional steps for growing or hardening non-hardened areas of the gate oxide layer remaining after the first RPN treatment. For example, the non-hardened portion of the gate oxide layer, or a portion thereof, may be grown to provide thick, non-hardened gate oxides for N-channel devices. Alternatively, the non-hardened portion of the gate oxide layer, or a portion thereof, may be grown and subsequently hardened to provide P-channel devices or N-channel devices having hardened gate oxides of varying thickness. The portion of the gate oxide layer hardened by the first RPN need not be masked during subsequent thermal oxidation and hardening steps because, once hardened, the gate oxide will not grow significantly when exposed to subsequent thermal oxidation processes. In fact, where implants are required through the gate oxide layer, it is beneficial not to mask the hardened portion of the gate oxide layer during subsequent thermal oxidation, as such a process will heal any implant damage done to the gate oxide layer.

As can be easily appreciated by one of skill in the art, the present invention enables fabrication of an IC device including N-channel and P-channel devices having hardened or non-hardened gate oxides of varying thicknesses without the need of the etch steps made necessary by known methods. Moreover, the method of the present invention may be easily integrated into known fabrication processes using known technology, and, because the method of the present invention does not require etching of the gate oxide layer to achieve gate oxides of varying thicknesses, the method of the present invention is cost effective and will continue to be useful as device dimensions shrink beyond the dimensions of those devices currently considered to be state of the art.

BRIEF DESCRIPTION OF THE SEVERAL VIEWS OF THE DRAWINGS

The figures presented in conjunction with this description are not actual views of any particular portion of an actual semiconducting device or component, but are merely representations employed to more clearly and fully depict the present invention.

DETAILED DESCRIPTION OF THE INVENTION

Figure 1:
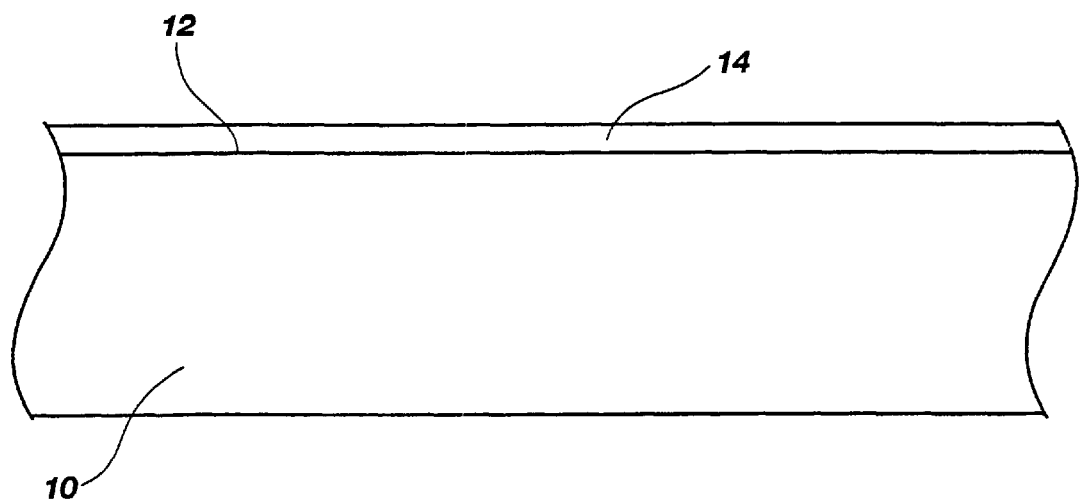
FIGS. 1 through 8 are cross-sectional views illustrating various steps of three different embodiments of the method of the present invention.

According to a first embodiment, the method of fabricating an IC device according to the present invention includes providing a semiconductor substrate 10 upon which N-channel devices and P-channel devices may be formed. Any suitable semiconductor substrate known in the art may be used, though a silicon semiconductor substrate is preferred. Further, if desired, the semiconductor substrate may include wells doped with N-type or P-type impurities, as is known in the art. As is shown in drawing FIG. 1, a gate oxide layer 14 is formed over the top surface 12 of the semiconductor substrate 10 using known deposition or thermal oxidation process. Thermal growth of the gate oxide layer 14, however, is preferred, as it provides an SiO$_2$ layer that is substantially free of contaminants. The gate oxide layer may be formed to any desired thickness, though, in the context of 0.18 μm technology, it is preferred to provide a gate oxide layer having a thickness in the range of substantially 30 Å to substantially 50 Å.

Figure 2:
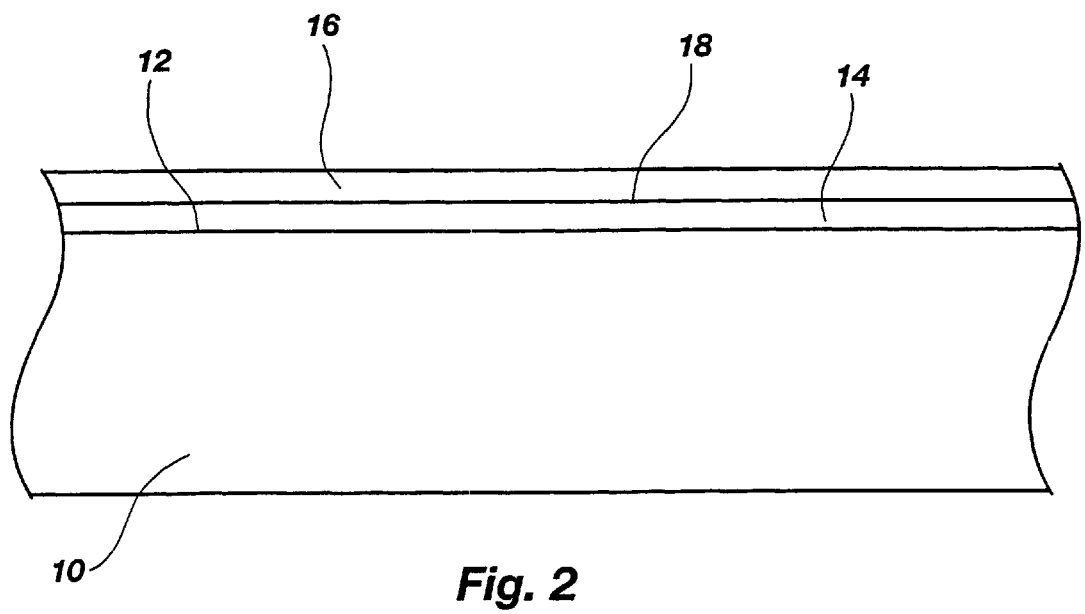
Figure 3:
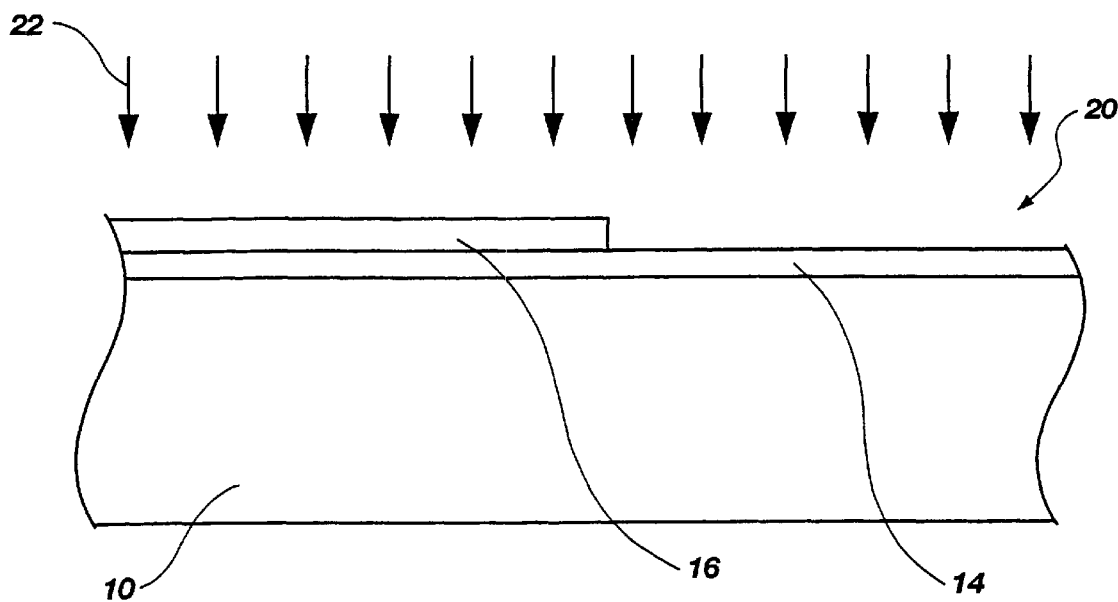

After formation of the gate oxide layer 14, a first resist layer 16 is deposited over the upper surface 18 of the gate oxide layer 14, as is shown in drawing FIG. 2. Any suitable resist may be used, and the resist may be deposited using well-known techniques, such as, for example, spin coating. Using known exposure and developing techniques, the first resist layer 16 is then patterned to expose an area 20 (seen in drawing FIG. 3) of the gate oxide layer 14 which is to be hardened. The exposed area 20 is then subjected to a first RPN treatment (indicated by arrows 22), which selectively hardens only the exposed area 20 of the gate oxide layer 14.

RPN treatments are well known in the art, and in the context of this invention, either a true RPN treatment or an HDP RPN treatment may be used. Generally, the process parameters of the RPN treatment used to harden the exposed area 20 of the gate oxide layer may be varied to produce desired results in various fabrication contexts. However, the temperature of the RPN treatment must be low enough that the patterned first resist layer 16 remains stable through the entire process. For example, it is presently preferred to use an HDP RPN conducted for approximately 1 second to approximately 30 seconds at about 30° C. to about 90° C. using about 800 watts to 3000 watts of power. Such a method effectively hardens the exposed area 20 of the gate oxide layer 14, yet runs at a temperature well below that which might render the resist unstable.

Figure 4:
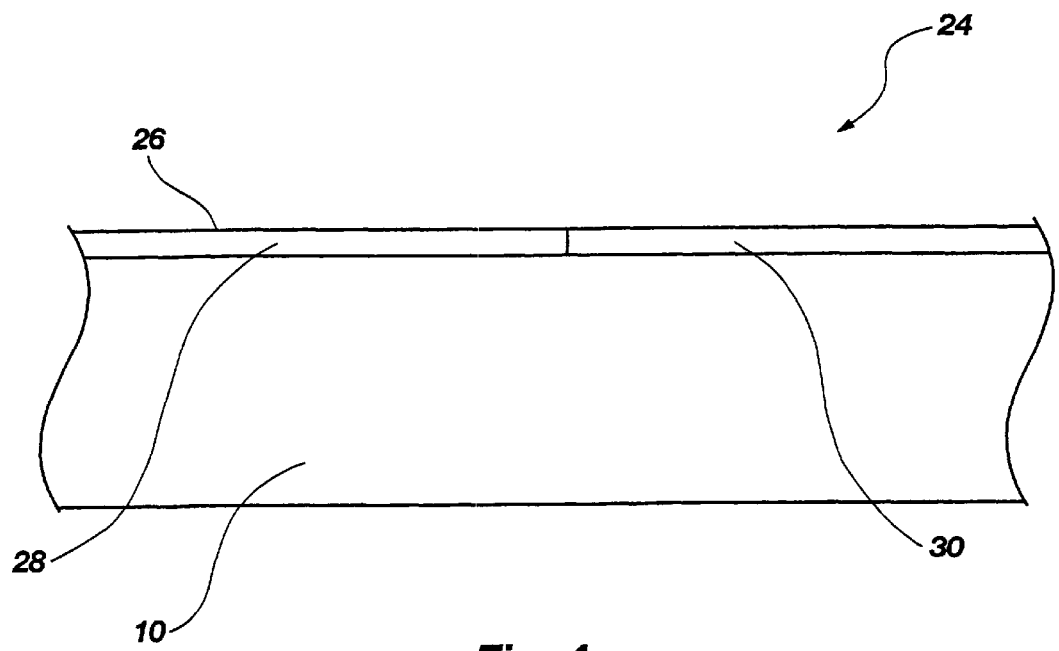

As can be seen in drawing FIG. 4, following the first RPN treatment 22, the remaining portions of the first resist layer 16 are removed, resulting in a first intermediate structure 24. The first intermediate structure 24 includes the semiconductor substrate 10 with a partially hardened gate oxide layer 26, which may be used as desired in the fabrication of N-channel or P-channel devices. Generally, the non-hardened portion 28 of the partially hardened gate oxide layer 26 will be used to fabricate at least one N-channel device, while the hardened portion 30 of the partially hardened gate oxide layer 26 will be used to fabricate at least one P-channel device. As will be appreciated by one of skill in the art, various methods for fabricating both N-channel and P-channel devices are well known, and after selectively hardening the gate oxide layer, the method of the present invention may include any suitable fabrication process necessary to complete fabrication of a desired IC device.

Figure 5:
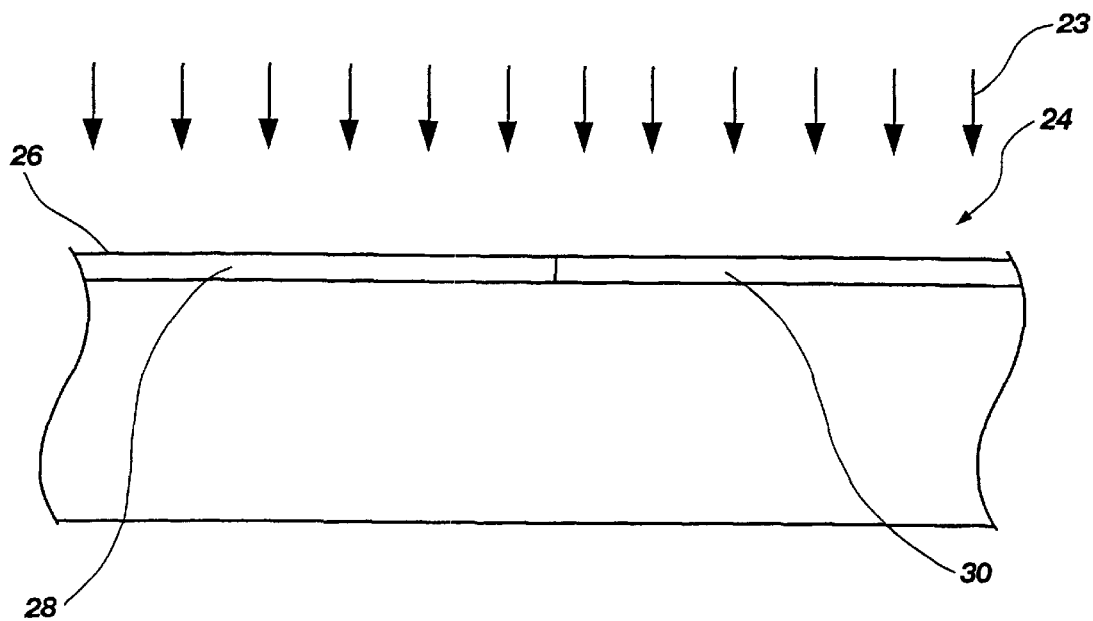

In a second embodiment of the method of the present invention, the partially hardened gate oxide layer 26 of the first intermediate structure 24 is further processed to provide an area of increased oxide thickness. As depicted in drawing FIG. 5, the second embodiment of the method of the present invention includes subjecting the first intermediate structure 24 to a thermal oxidation process (indicated by arrows 23). Thermal oxidation of the first intermediate structure causes the growth of the non-hardened portion 28 of the partially hardened gate oxide layer 26. Though the non-hardened portion may be grown to any desired thickness, where the original thickness of the gate oxide layer is in the range of substantially 30 Å to substantially 50 Å, it is presently preferred to grow the non-hardened gate oxide to a thickness in the range of substantially 50 Å to substantially 70 Å. Moreover, though the hardened portion 30 of the partially hardened gate oxide layer 26 will not grow substantially, the thermal oxidation process will heal any implant damage caused to all portions of the gate oxide layer due to any necessary implant steps. Thermal oxidation of the first intermediate structure 24, therefore, results in a second intermediate structure 31 (illustrated in drawing FIG. 6)

including a second partially hardened gate oxide layer 32 characterized by a hardened portion 30 and a thick, non-hardened portion 34.

Figure 6:
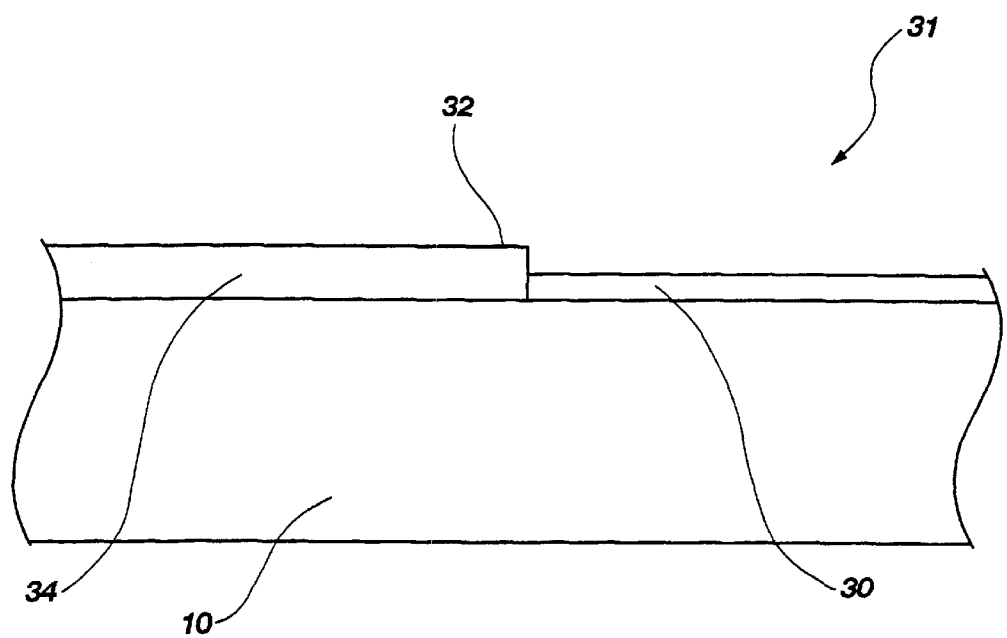

As was true with the partially hardened gate oxide layer 26 of the first intermediate structure 24 formed by the first embodiment of the method of the present invention, the second partially hardened gate oxide layer 32 may be used as desired to form gate oxides for N-channel or P-channel devices. For example, the thick, non-hardened portion 34 of the second partially hardened gate oxide layer 32 may be used to form a gate oxide for one or more N-channel devices, while the hardened portion 30 of the second partially hardened gate oxide layer 32 may be used to form a gate oxide for one or more P-channel devices. Again, various methods for fabricating an IC device including N-channel and P-channel devices using an intermediate structure, such as the second intermediate structure 31 illustrated in drawing FIG. 6, are well known, and the method of the present invention may include any such suitable method.

The second embodiment of the method of the present invention is desirable because it allows fabrication of an IC device including both an array of P-channels having thin, hardened gate oxides and an array of N-channel devices having thick, non-hardened gate oxides. Thickening the non-hardened gate oxides of N-channel devices results in N-channel devices characterized by a higher $V_T$, and increasing device $V_T$ provides increased device control and enables better differentiation between N-channel and P-channel devices.

Figure 8:
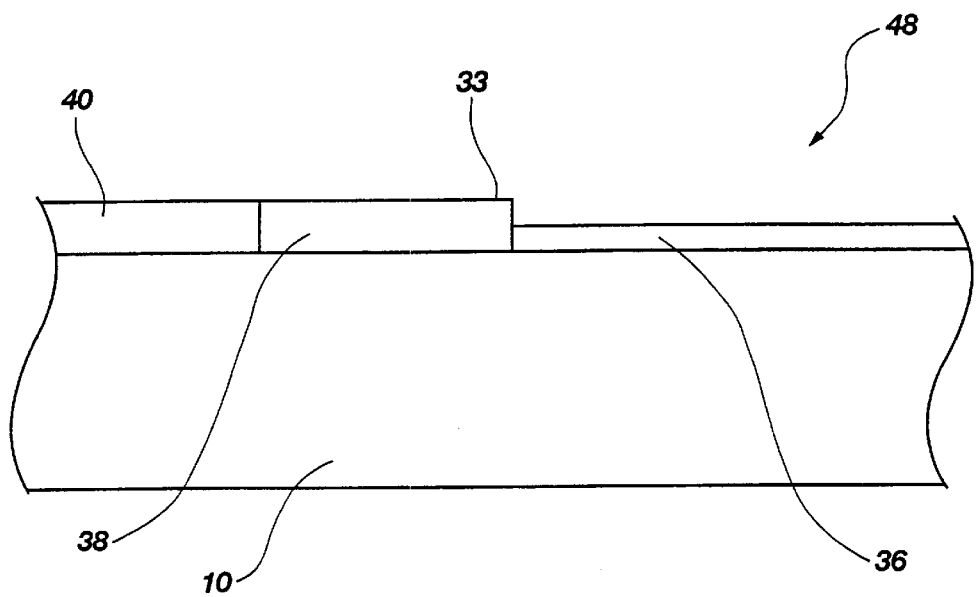

In a third embodiment of the method of the present invention, the second intermediate structure 31 is further processed to produce a third partially hardened gate oxide layer 33 having a first hardened portion 36, a second hardened portion 38 (shown in FIG. 8), and a non-hardened portion 40. As can be easily appreciated from drawing FIG. 8, both the second hardened portion 38 and the non-hardened portion 40 are thicker than the first hardened portion 36 of the third partially hardened gate oxide layer 33.

Figure 7:
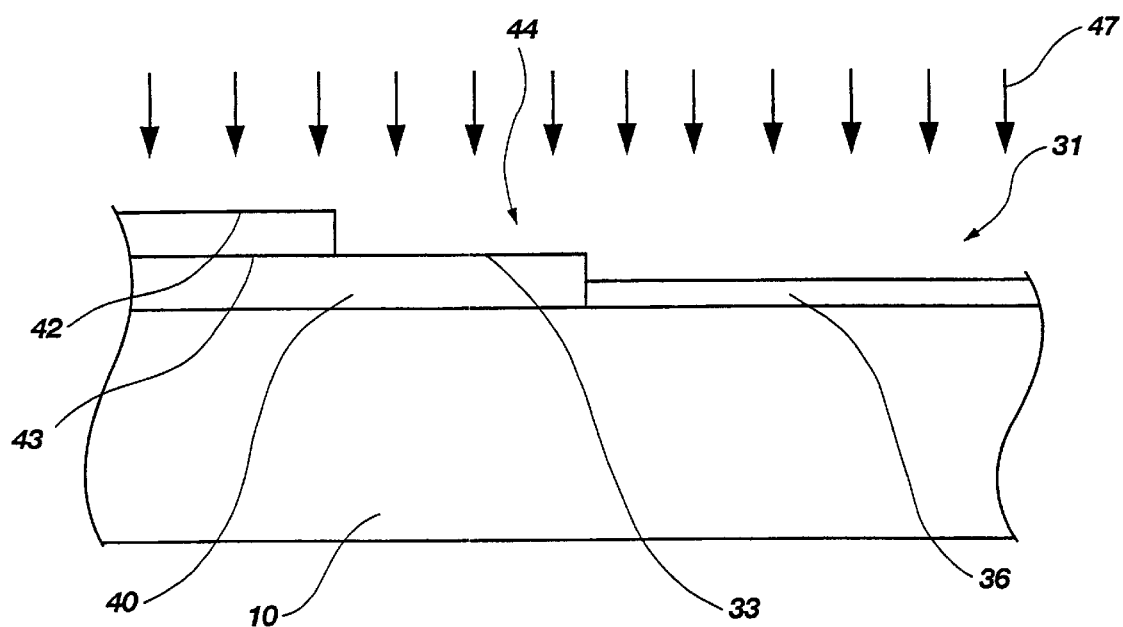

According to the third embodiment, a second resist layer 42 is formed over the top surface 43 of the third partially hardened gate oxide layer 33 of the second intermediate structure 31 (illustrated in drawing FIG. 7). The second resist layer 42 is then patterned by techniques known in the art to expose at least an area 44 of the thick, non-hardened portion 40 of the third partially hardened gate oxide layer 33. The exposed area 44 is then subjected to a second RPN treatment 47, such as the preferred RPN treatment discussed herein. The second RPN treatment selectively hardens the exposed area 44 of the non-hardened portion 40 of the third partially hardened gate oxide layer 33. However, those areas of the thick, non-hardened portion 40 of the third partially hardened gate oxide layer 33 underlying the second resist layer 42 are not affected by the RPN treatment because the second resist layer 42 remains stable through the RPN process. Therefore, after the remaining portions of the second resist layer 42 are removed, the third embodiment of the method of the present invention provides a third intermediate structure 48 that may be further processed by known techniques to provide a desired IC device. For example, the first hardened portion 36 of the third partially hardened gate oxide layer 33 may be used to form one or more P-channel devices having thin, hardened gate oxides, the second hardened portion 38 of the third partially hardened gate oxide layer 33 may be used to form one or more P-channel devices having thick (preferably in the range of substantially 50 Å to substantially 70 Å), hardened gate oxides, and the thick, non-hardened portion 40 of the third partially hardened gate oxide layer 33 may be used to form N-channel devices including thick (preferably in the range of substantially 50 Å to substantially 70 Å), non-hardened gate oxides.

Of course, it should be understood that the three embodiments of the method of the present invention discussed herein are provided for illustrative purposes only. The method of the present invention is easily varied to provide IC devices having any desired combinations of hardened or non-hardened gate oxides of varying thicknesses. For example, the first resist layer used in the first and second embodiments of the method of the present invention may be patterned such that, following the RPN process, multiple hardened or non-hardened portions are formed within the gate oxide layer. Additionally, where multiple non-hardened portions are formed within the gate oxide layer, the intermediate structure may be processed according to the second embodiment of the method of the present invention to produce a partially hardened gate oxide layer including one or more hardened portions as well as multiple thick, non-hardened portions, which may be used in fabricating thick gate oxides for N-channel devices. Finally, use of additional masking, growth, and RPN steps can produce virtually any number of different hardened areas of varying thicknesses within a single gate oxide layer. Such a gate oxide layer can be used to form an IC device having any desired combination of selectively hardened N-channel or P-channel devices having gate oxides of different thicknesses.

Moreover, though the described embodiments have discussed the use of the non-hardened portions of a gate oxide layer for fabrication of N-channel devices, it should be understood that, as mentioned, it is often desirable to created an IC device including one or more N-channel devices having a hardened gate oxide, particularly where long, peripheral N-channel devices are included in an IC device. Hardening of long N-channel devices increases the $V_T$ of such devices and decreases problems with charge leakage, and, as can be easily appreciated by the ordinarily skilled artisan, any of the hardened portions of the partially hardened gate oxide layers produced in any embodiment of the present invention may be used to fabricate one or more hardened N-channel devices. Further, the patterned resist used in any embodiment of the method of the present invention may be patterned such that one or more specific areas of the gate oxide layer to be used for fabrication of hardened N-channel devices are hardened by the RPN treatment.

In many of its embodiments, the method of the present invention is advantageous from more than one perspective. The method of the present invention enables fabrication of IC devices including any desired combination of selectively hardened N-channel and P-channel devices. Selectively hardening the various devices included in the IC device enhances performance characteristics of the IC device and avoids the compounding performance problems generally presented by hardened N-channel devices. Moreover, the method of the present invention allows fabrication of hardened or non-hardened N-channel and P-channel devices having gate oxides of varying thicknesses without the need for the additional etch steps required by known fabrication processes. By eliminating the need for one or more etch steps, the method of the present invention provides a more cost effective alternative to known methods and eliminates at least one unnecessary source of error in the fabrication process.

It should be understood that the method of the present invention is broadly applicable and is easily adapted for use in any desired process for fabricating IC devices. Therefore, even though the method of the present invention is described herein with reference to specific examples and figures, such examples and figures are provided for illustrative purposes only. The scope of the present invention is defined by the appended claims and is not limited by the preceding description and drawings.

What is claimed is:

1. A method for hardening at least a portion of a gate oxide layer on a substrate, comprising:
   forming an oxide layer over at least a portion of the substrate;
   forming a resist over at least a portion of the oxide layer;
   patterning the resist to create at least one exposed area of the oxide layer;
   hardening the at least one exposed area of the oxide layer using a remote plasma nitrogen hardening treatment;
   forming a second resist over at least a portion of the oxide layer;
   patterning the second resist to create at least one exposed area of the oxide layer; and
   conducting a second remote plasma nitrogen hardening treatment to create at least one second hardened area and at least one non-hardened area within the oxide layer.

2. The method of claim 1, wherein the substrate comprises a silicon substrate.

3. The method of claim 2, wherein forming an oxide layer over at least a portion of the substrate comprises thermally growing an oxide layer.

4. The method of claim 1, wherein hardening the at least one exposed area of the oxide layer using the remote plasma nitrogen hardening treatment comprises using a high-density plasma remote plasma nitrogen hardening treatment.

5. The method of claim 4, wherein using the high density plasma remote plasma nitrogen hardening treatment comprises using a process run for in the range of approximately 1 second to approximately 30 seconds at a temperature of between about 30° C. and about 90° C. using about 800 watts to 3000 watts of power.

6. The method of claim 1, wherein forming the oxide layer over at least a portion of the substrate comprises forming an oxide layer having a thickness of about 30° C. to about 50° C.

7. The method of claim 1, wherein patterning the resist to create at least one exposed area of the oxide layer comprises patterning the resist to create a plurality of exposed areas of the oxide layer.

8. A method for fabricating an integrated circuit device including N-channel and P-channel devices having selectively hardened gate oxides on a substrate, the method comprising:
   forming an oxide layer over at least a portion of the substrate;
   forming a first resist over at least a portion of the oxide layer;
   patterning the first resist to create at least one exposed area of the oxide layer and at least one covered area of the oxide layer;
   conducting a first remote plasma nitrogen treatment to create at least one hardened area within the oxide layer and at least one non-hardened area within the oxide layer;
   stripping the first resist;
   growing at least a portion of the at least one non-hardened area within the oxide layer using a thermal oxidation process to form at least one thick area within the oxide layer;
   forming a second resist over at least a portion of the at least one thick area within the oxide layer;
   patterning the second resist to create at least one exposed area of the at least one thick area; and
   conducting a second remote plasma nitrogen treatment to create at least one second hardened area and at least one second non-hardened area within the at least one thick area of the oxide layer.

9. The method of claim 8, wherein the substrate comprises a silicon substrate and forming the oxide layer over at least a portion of the substrate comprises thermally growing the oxide layer from the silicon substrate.

10. The method of claim 8, wherein conducting the first remote plasma nitrogen treatment to create at least one hardened area within the oxide layer and at least one non-hardened area within the oxide layer comprises conducting a high-density plasma remote plasma nitrogen treatment.

11. The method of claim 10, wherein conducting the high density plasma remote plasma nitrogen treatment comprises conducting a process run for approximately 1 second to approximately 10 seconds at between about 30° C. and about 90° C. using about 800 watts to 3000 watts of power.

12. The method of claim 1, wherein forming the oxide layer over the substrate comprises forming an oxide layer having a thickness of about 30° C. to about 50° C. and growing at least a portion of the at least one non-hardened area within the oxide layer using the thermal oxidation process to form at least one thick area within the oxide layer comprises growing at least a portion of the at least one non-hardened area to a thickness of about 50° C. to about 70°C.

13. The method of claim 8, further comprising processing the substrate and the oxide layer to produce an integrated circuit device including at least one P-channel device including a hardened gate oxide and at least one N-channel device including a non-hardened gate oxide.

14. A method for fabricating an integrated circuit device including N-channel and P-channel devices on a substrate, each N-channel and P-channel device having selectively hardened gate oxides, the method comprising:
   forming an oxide layer over at least a portion of the substrate;
   forming a first resist over at least a portion of the oxide layer;
   patterning the first resist to create at least one exposed area of the oxide layer and at least one covered area of the oxide layer;
   conducting a first remote plasma nitrogen hardening treatment to create at least one hardened area within the oxide layer and at least one non-hardened area within the oxide layer;
   stripping the first resist;
   growing at least a portion of the at least one non-hardened area within the oxide layer using a thermal oxidation process to form at least one thick area within the oxide layer;
   forming a second resist over at least a portion of the at least one thick area within the oxide layer;
   patterning the second resist to create at least one exposed area of the at least one thick area; and
   conducting a second remote plasma nitrogen hardening treatment to create at least one second hardened area and at least one second non-hardened area within the at least one thick area of the oxide layer.

15. A method for fabricating a dynamic random access memory device on a substrate comprising:

forming an oxide layer over at least a portion of the substrate;

forming a resist over at least a portion of the oxide layer;

patterning the resist to create at least one exposed area of the oxide layer;

hardening the at least one exposed area of the oxide layer using a remote plasma nitrogen hardening treatment;

processing the substrate and the oxide layer to create at least one P-channel device having a hardened oxide and an array of N-channel devices, each of the N-channel devices included within the array having a non-hardened gate oxide;

forming a second resist over at least a portion within the oxide layer;

patterning the second resist to create at least one exposed area of the oxide layer; and conducting a second remote plasma nitrogen hardening treatment to create at least one second hardened area and at least one non-hardened area within the oxide layer.

16. The method of claim 15, wherein the substrate comprises a silicon substrate and forming an oxide layer over the substrate comprises growing an oxide layer from the silicon substrate.

17. The method of claim 15, wherein hardening the at least one exposed area of the oxide layer using the remote plasma nitrogen hardening treatment comprises using a high-density plasma remote plasma nitrogen hardening treatment.

18. The method of claim 17, wherein using the high-density plasma remote plasma nitrogen hardening treatment comprises using a process run for approximately 1 second to approximately 30 seconds at between about 30° C. and about 90° C. using about 800 watts to about 3000 watts of power.

19. The method of claim 15, wherein forming the oxide layer over the substrate comprises forming an oxide layer having a thickness of about 30 Å to about 50 Å.

20. The method of claim 15, wherein patterning the resist to create at least one exposed area of the oxide layer comprises patterning the resist to create a plurality of exposed areas of the oxide layer.

* * * * *

UNITED STATES PATENT AND TRADEMARK OFFICE
CERTIFICATE OF CORRECTION

PATENT NO. : 6,699,743 B2  Page 1 of 1
APPLICATION NO. : 10/198215
DATED : March 2, 2004
INVENTOR(S) : John T. Moore and Mark Fischer It is certified that error appears in the above-identified patent and that said Letters Patent is hereby corrected as shown below:

On the title page:
In ITEM (54) "Title,"  change "MASKED NITROGEN ENHANCED GATE OXIDE" to --METHODS FOR NOVEL MASKED NITROGEN ENHANCED GATE OXIDE--

In the specification:
COLUMN 1, LINE 1-2,  change MASKED NITROGEN ENHANCED GATE OXIDE" to --METHODS FOR NOVEL MASKED NITROGEN ENHANCED GATE OXIDE--
COLUMN 6, LINE 32,  change "created" to --create--

In the claims:
CLAIM 6, COLUMN 7, LINES 42-43,  change "30° C. to about 50° C." to --30 Å to about 50 Å.--
CLAIM 12, COLUMN 8, LINE 26,  change "30° C. to about 50° C." to --30 Å to about 50 Å--
CLAIM 12, COLUMN 8, LINES 31-32,  change "50° C. to about 70° C." to --50 Å to about 70 Å.--

Signed and Sealed this

Twenty-sixth Day of June, 2007

JON W. DUDAS
*Director of the United States Patent and Trademark Office*